US007821433B2

(12) United States Patent
Abe

(10) Patent No.: US 7,821,433 B2
(45) Date of Patent: Oct. 26, 2010

(54) PIPELINE-TYPE ANALOG-TO-DIGITAL CONVERTER

(75) Inventor: Akira Abe, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/406,490

(22) Filed: Mar. 18, 2009

(65) Prior Publication Data

US 2009/0243901 A1 Oct. 1, 2009

(30) Foreign Application Priority Data

Mar. 27, 2008  (JP)  ............................. 2008-084188

(51) Int. Cl.
*H03M 1/06* (2006.01)

(52) U.S. Cl. ....................... 341/118; 341/161; 341/162; 341/172

(58) Field of Classification Search ................. 341/118, 341/161, 162
See application file for complete search history.

(56) References Cited

U.S. PATENT DOCUMENTS

| 5,929,796 | A | * | 7/1999 | Opris et al. | ................. | 341/120 |
| 6,097,326 | A | * | 8/2000 | Opris et al. | ................. | 341/161 |
| 6,184,809 | B1 | * | 2/2001 | Yu | .............................. | 341/120 |
| 6,606,042 | B2 | * | 8/2003 | Sonkusale et al. | ........... | 341/120 |
| 6,801,151 | B1 | * | 10/2004 | Opris | ......................... | 341/161 |
| 7,612,701 | B2 | * | 11/2009 | Cho et al. | .................... | 341/161 |
| 7,612,703 | B2 | * | 11/2009 | Chen et al. | ................... | 341/172 |

FOREIGN PATENT DOCUMENTS

| JP | A-11-214997 | 8/1999 |
| JP | A-2002-368618 | 12/2002 |
| JP | A-2005-252326 | 9/2005 |
| JP | A-2006-054608 | 2/2006 |

\* cited by examiner

*Primary Examiner*—Khai M Nguyen
(74) *Attorney, Agent, or Firm*—Oliff & Berridge, PLC

(57) ABSTRACT

A pipeline-type A/D converter includes: N number of stages cascade-connected; and a digital correction circuit that receives digital signals outputted from the N number of stages and outputs a final digital signal. In the converter, an Mth stage in the N number of stages includes: a sub A/D converter A/D-converting an input analog signal; a sub D/A converter D/A converting a digital signal outputted from the sub A/D converter; a differential amplifier circuit that includes a sample hold circuit and an operational amplifier, performs an sampling operation and a holding operation to obtain a difference between the input analog signal and an output signal of the sub D/A converter, and amplifies the difference; and a compensation circuit compensating a gain error of the operational amplifier in an operation of the differential amplifier circuit, the gain error being caused by parasitic capacitance between an input terminal and an output terminal of the operational amplifier, and $1 \leq M < N$.

6 Claims, 11 Drawing Sheets

AT SAMPLING

AT HOLDING
(AT COMPUTING)

PIPELINE-TYPE ANALOG-TO-DIGITAL CONVERTER

BACKGROUND

1. Technical Field

The present invention relates to a pipeline-type analog-to-digital converter.

2. Related Art

Conventionally, there has been known a pipeline-type analog-to-digital (A/D) converter in which an A/D converting stage (stage) of a small bit number is cascade-connected and digital values obtained in each stage are computed so as to obtain a final digital value. For example, refer to JP-A-2005-252326.

In each stage, an input analog signal is quantized by a sub A/D converter to be converted into a digital signal, and then the digital signal is digital-to analog converted by a sub D/A converter. The input analog signal and the analog signal produced by the sub D/A converter are subjected to a subtraction process. The resulting signal is amplified by an operational amplifier to be outputted to a subsequent stage.

In the pipeline-type A/D converter, a good linearity is required in which a relation between an analog input and a digital output shows a line. The linearity of the input and output signals, however, has not been thoroughly examined in known patents. Thus, improving the input-output linearity has been expected.

SUMMARY

An advantage of the invention is to provide a pipeline-type A/D converter having improved linearity between an analog input and a digital output.

In order to achieve this advantage, the invention includes the following aspects.

According to a first aspect of the invention, a pipeline-type analog-to-digital (A/D) converter includes N number of stages cascade-connected (a first stage to an Nth stage), and a digital correction circuit that receives digital signals outputted from the N number of stages and outputs a final digital signal. In the converter, an Mth (1≦M<N) stage in the N number of stages includes: a sub A/D converter A/D-converting an input analog signal; a differential amplifier circuit that includes a sub digital-to-analog (D/A) converter D/A converting a digital signal outputted from the sub A/D converter, a sample hold circuit, and an operational amplifier, performs an sampling operation and a holding operation to obtain a difference between the input analog signal and an output signal of the sub D/A converter, and amplifies the difference; and a compensation circuit compensating a gain error, due to parasitic capacitance between an input terminal and an output terminal of the operational amplifier, of the operational amplifier in an operation of the differential amplifier circuit.

In the converter, the compensation circuit may compensate, in the operation of the differential amplifier circuit, an electric charge flowing into the parasitic capacitance between the input terminal and the output terminal of the operational amplifier from a capacitor of the sample hold circuit with respect to the capacitor.

In the converter, the compensation circuit may include a first circuit and a second circuit. The first circuit may have a first switch selecting the input analog signal, a second switch selecting a predetermined potential, and a first compensation capacitor that selectively receives the input analog signal selected by the first switch and the predetermined potential selected by the second switch, and one end of the first compensation capacitor is coupled to the input terminal of the operational amplifier. The second circuit may have a third switch selecting the output signal of the sub D/A converter, a fourth switch selecting the predetermined potential, and a second compensation capacitor that selectively receives the output signal selected by the third switch and the predetermined potential selected by the fourth switch, and one end of the second capacitor is coupled to the input terminal of the operational amplifier.

In the compensation circuit, in the sampling operation of the sample hold circuit, the first switch may select the input analog signal to input the selected input analog signal to the first compensation capacitor, and the fourth switch may select the predetermined potential to input the selected predetermined potential to the second compensation capacitor, while, in the holding operation of the sample hold circuit, the second switch may select the predetermined potential to input the selected predetermined potential to the first compensation capacitor, and the third switch may select the output signal of the sub D/A converter to input the selected output signal to the second compensation capacitor.

According to a second aspect of the invention, a pipeline-type A/D converter includes N number of stages cascade-connected (a first stage to an Nth stage), and a digital correction circuit that receives digital signals outputted from the N number of stages and outputs a final digital signal. In the converter, an Mth stage (1≦M<N) and an M+1th stage in the N number of stages commonly use an operational amplifier in a time-sharing manner. The Mth stage includes: a first sub A/D converter A/D-converting an input analog signal; a first sub D/A converter D/A converting a digital signal outputted from the first sub A/D converter; a first differential amplifier circuit that includes a first sample hold circuit, performs an sampling operation and a holding operation to obtain a difference between the input analog signal and an output signal of the first sub D/A converter, and amplifies the difference; and a first compensation circuit compensating a gain error caused by parasitic capacitance between an input terminal and an output terminal of the operational amplifier of the operational amplifier, if the first differential amplifier circuit uses the operational amplifier. The M+1th stage includes: a second sub A/D converter A/D-converting an analog signal outputted from the operational amplifier; a second differential amplifier circuit that includes a second sample hold circuit, performs an sampling operation and a holding operation to obtain a difference between the analog signal outputted from the operational amplifier and an output signal of the second sub D/A converter, and amplifies the difference; and a second compensation circuit compensating a gain error caused by the parasitic capacitance between the input terminal and the output terminal of the operational amplifier of the operational amplifier if the second differential amplifier circuit uses the operational amplifier.

In the converter, the operational amplifier may be of a fully-differential type.

According to the invention, the gain error due to parasitic capacitance between the input and output terminals of the operational amplifier included in each stage is compensated as described above. As a result, the linearity between the analog input and the digital output can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

First Embodiment

Figure 1:
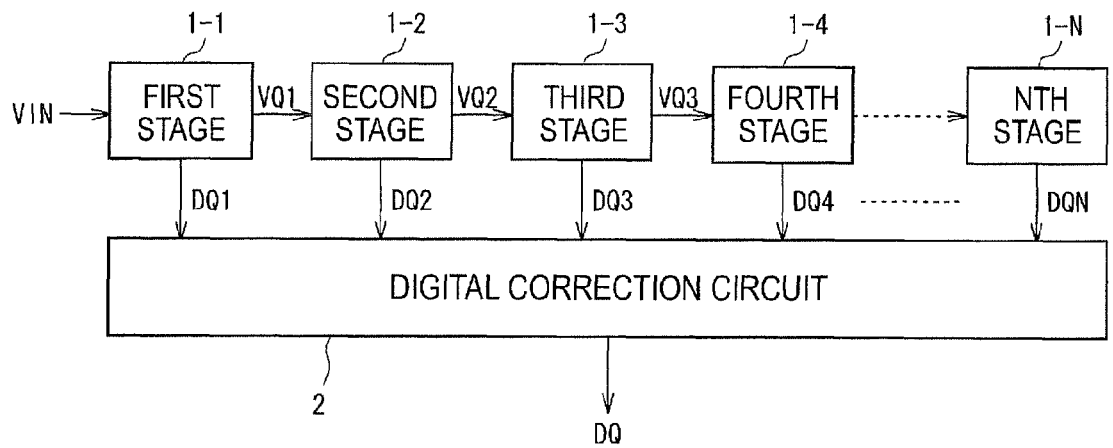
FIG. 1 is a block diagram showing a whole structure of a first embodiment of the invention.

FIG. 1 is a block diagram showing a whole structure of a first embodiment of a pipeline-type A/D converter according to the invention.

A pipeline-type A/D converter of the first embodiment includes a plurality of stages cascade-connected as shown in FIG. 1. The plurality of stages includes a first stage 1-1 to an $N^{th}$ stage 1-N. The converter also includes a digital correction circuit (error correction circuit) 2, to which output digital signals DQ-1 to DQN are inputted from the first stage 1-1 to the $N^{th}$ stage 1-N, and from which a final digital signal DQ is outputted.

In FIG. 1, the stages 1-1 to 1-(N-1) output digital signals DQ-1 to DQN-1 of 1.5 bits including a redundancy of 0.5 bits, for example. The final stage 1-N outputs the digital signal DQN of 2 bits. In the digital correction circuit 2, the values of the digital signals DQ1 to DQN are weighted and added so as to be outputted as the final digital signal DQ. The digital signals DQ1 to DQN are of 1.5 bits or 2 bits outputted from the stages 1-1 to 1-N as described above.

The invention pays attention to the point that the input-output characteristic of an input analog signal VIN and an output digital signal DQ shown in FIG. 1 does not show a line, but shows discontinuous points, i.e., a differential nonlinearity error occurs. In addition, the inventor of the invention found that the error was a gain error of the amplifier (differential amplifier) included in the stages 1-1 to 1-(N-1), specifically, due to parasitic capacitance between the input and output terminals of the amplifier. The gain error is compensated in the invention.

In the first embodiment, a compensation circuit 56 is provided to compensate the gain error of an amplifier 30 due to parasitic capacitance between the input and output terminals of the amplifier 30 included in each of the stages 1-1 to 1-(N-1). Details are described later.

Figure 2:
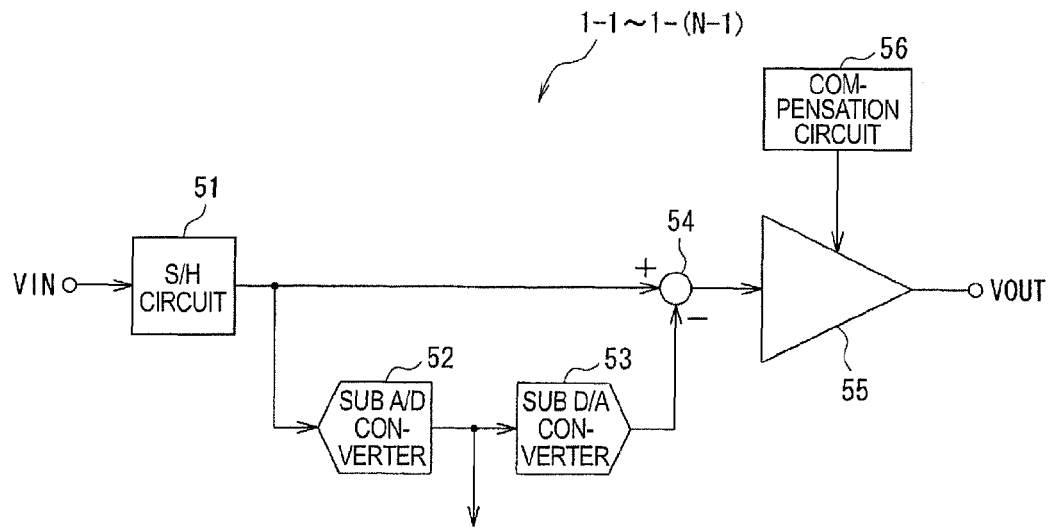
FIG. 2 is a block diagram functionally showing a structure of a stage shown in FIG. 1.

FIG. 2 is a block diagram functionally showing a structure of each of the stages of 1-1 to 1-(N-1).

As shown in FIG. 2, each stage includes a sample hold circuit (S/H circuit) 51, a sub A/D converter 52, a sub D/A converter 53, a subtracter 54, an amplifier 55, and the compensation circuit 56.

Here, the sample hold circuit 51, the subtracter 54, and the amplifier 55 constitute a differential amplifier circuit of the invention.

The sample hold circuit 51 samples and holds the input analog signal VIN. The sub A/D converter 52 A/D-converts the output of the sample hold circuit 51 to output a digital signal of 1.5 bits. The sub D/A converter 53 D/A-converts the digital signal outputted from the sub A/D converter 52 to output an analog signal.

The subtracter 54 subtracts the analog signal outputted from the sub D/A converter 53 from the analog signal outputted from the sample hold circuit 51. The amplifier 55 amplifies the analog signal outputted from the subtracter 54 to double, and outputs the amplified analog signal as an output signal VOUT. The compensation circuit 56 compensates the gain error (output error) of the amplifier 55 due to parasitic capacitance between the input and output terminals of the amplifier 55 as described later.

In the example shown in FIG. 2, the sub A/D converter 52 A/D-converts the output of the sample hold circuit 51. Alternatively, the input analog signal VIN may be A/D-converted.

Figure 3:
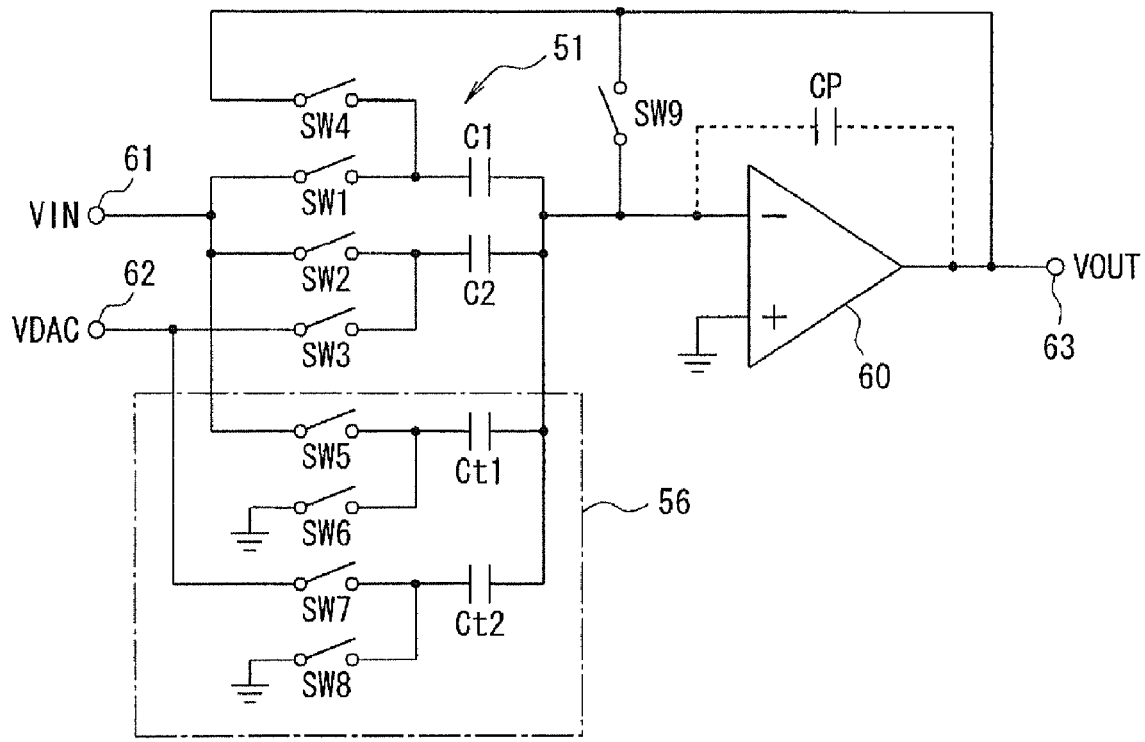
FIG. 3 is a circuit diagram showing a specific structure of a sample hold circuit, a subtracter, an amplifier, and a compensation circuit shown in FIG. 2.

FIG. 3 is a circuit diagram showing a specific structure of the sample hold circuit 51, the subtracter 54, the amplifier 55, and the compensation circuit 56 out of elements included in the stage shown in FIG. 2.

Here, an operational amplifier 60 in FIG. 3 corresponds to the subtracter 54 and the amplifier 55 in FIG. 2. The sample hold circuit 51 and the operational amplifier 60 shown in FIG. 3 constitute the differential amplifier circuit of the invention.

The sample hold circuit 51 includes, as shown in FIG. 3, switches SW1 to SW4 and SW9 each composed of a switching element and the like, and capacitors C1 and C2.

More specifically, the switches SW1 and SW2 are connected in common at one end thereof. The common connection part is connected to a first input terminal 61. The other end of the switch SW1 is connected to the inverting input terminal (−) of the operational amplifier 60 through the capacitor C1. The other end of the switch SW2 is connected to the inverting input terminal (−) of the operational amplifier 60 through the capacitor C2. The common connection part of the switches SW1 and SW2 is connected to the output terminal of the operational amplifier 60 through the switch SW4. The common connection part of the switch SW2 and the capacitor C2 is connected to a second input terminal 62 through a switch SW3.

A non-inverting input terminal (+) of the operational amplifier 60 is grounded. The output terminal of the operational amplifier 60 is connected to an output terminal 63. In addition, between the input and output terminals of the operational amplifier 60, i.e., between the inverting input terminal and the non-inverting input terminal, there is parasitic capacitance CP, which is not negligible in causing the gain error of the operational amplifier 60.

The compensation circuit 56 includes switches SW5 to SW8 each composed of a switching element and the like, and compensation capacitors Ct1 and Ct2. The switches SW5 and SW6, and the compensation capacitors Ct1 and Ct2 function to compensate the output gain error (output error) of the operational amplifier 60.

In other words, the switches SW5 and SW6, and the compensation capacitor Ct1 function to compensate a gain error relating to an input voltage VIN. The switches SW7 and SW8, and the compensation capacitor Ct2 function to compensate the output error of a voltage VDAC that is outputted from the sub D/A converter 53 and inputted to the switch SW 7.

More specifically, one end of the switch SW5 is connected to the first input terminal 61 while the other end thereof is connected to the inverting input terminal of the operational amplifier 60 through the compensation capacitor Ct1. The common connection part of the switch SW5 and the compensation capacitor Ct1 is grounded through the switch SW6.

One end of the switch SW7 is connected to the second input terminal 62 while the other end thereof is connected to the inverting input terminal of the operational amplifier 60 through the compensation capacitor Ct2. The common connection part of the switch SW7 and the compensation capacitor Ct2 is grounded through the switch SW8.

The first embodiment according to the invention pays attention to the point that discontinuous points, i.e., a differential nonlinearity error occurs in the input-output characteristic of the input analog signal VIN and the output digital signal DQ shown in FIG. 1. In addition, the inventor of the invention found that the error was the gain error of the differential amplifier (operational amplifier) included in the stages, specifically, due to parasitic capacitance between the input and output terminals of the differential amplifier. The gain error is compensated in the embodiment.

As can be understood from the above, the feature of the first embodiment is that the compensation circuit 56 is provided to compensate the output gain error of the operational amplifier 60 due to the parasitic capacitance CP between the input and output terminals of the operational amplifier 60 included in each stage.

Before describing the operation of the circuit shown in FIG. 3, operational failures of the sample hold circuit 51 and the operational amplifier 60 in a case where the compensation circuit 56 is not provided and necessity of the compensation circuit 56 are described with reference to FIGS. 5 to 7B.

Figure 5:
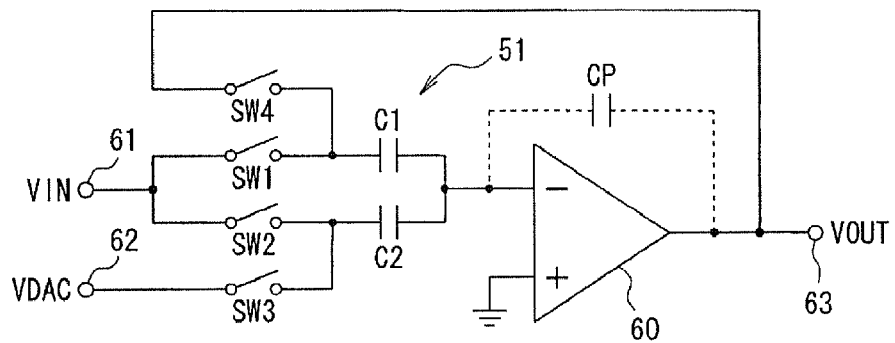
FIG. 5 is a circuit diagram in which the compensation circuit is omitted from the circuit shown in FIG. 3.

First, a case where the parasitic capacitance CP between the input and output terminals of the operational amplifier 60 is negligible is described with reference to FIGS. 5, 6A and 6B.

The sample hold circuit 51 performs sampling and holding operations (computing operation) based on the input voltage VIN and the analog voltage VDAC outputted from the sub D/A converter 53, and a desired output voltage VOUT is outputted.

Figure 6A:
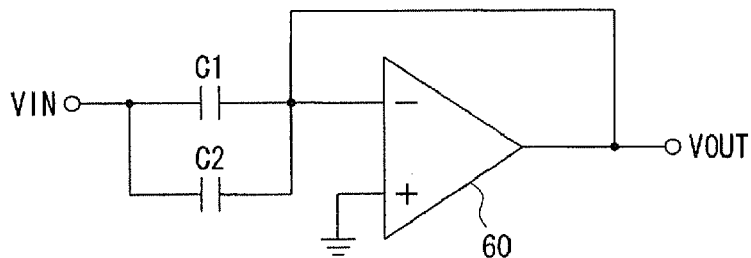
FIGS. 6A and 6B are views to explain the operation of the circuit shown in FIG. 5 in a case where parasitic capacitance is negligible.

In the sampling operation, the condition is shown in FIG. 6A. Electric charge QS stored in the capacitors C1 and C2 is expressed in the following formula.

$$QS=(C1+C2)\times(VIN)$$

Figure 6B:
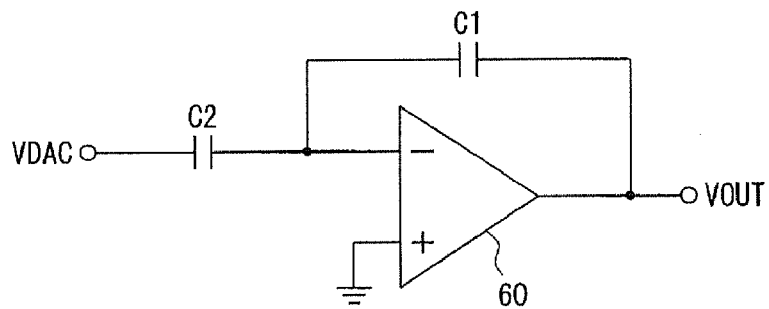

In contrast, in the holding operation, the condition is shown in FIG. 6B. Electric charge QH stored in the capacitors C1 and C2 is expressed in the following formula.

$$QH=C1\times VOUT+C2\times VDAC$$

Here, QS=QH from a low of conservation of electric charge. Thus, the following formula is true.

$$(C1+C2)\times(VIN)=C1\times VOUT+C2\times VDAC$$

If the capacitance values of the capacitors C1 and C2 are equal to C, i.e., C1=C2=C, the following formula can be obtained.

$$2\times C\times VIN=C\times VOUT+C\times VDAC$$

As a result, the output voltage VOUT is expressed in formula (1).

$$VOUT=2\times VIN-VDAC \quad \text{formula (1)}$$

Here, the output analog voltage VDAC from the sub D/A converter 53 is either one of +VREF, 0V, and −VREF, which are selected based on a result of comparing the signal VIN and +(VREF/4) and −(VREF/4) in the sub A/D converter 52.

Next, a case where the parasitic capacitance CP between the input and output terminals of the operational amplifier 60 is not negligible is described with reference to FIGS. 5, 7A, and 7B.

Figure 7A:
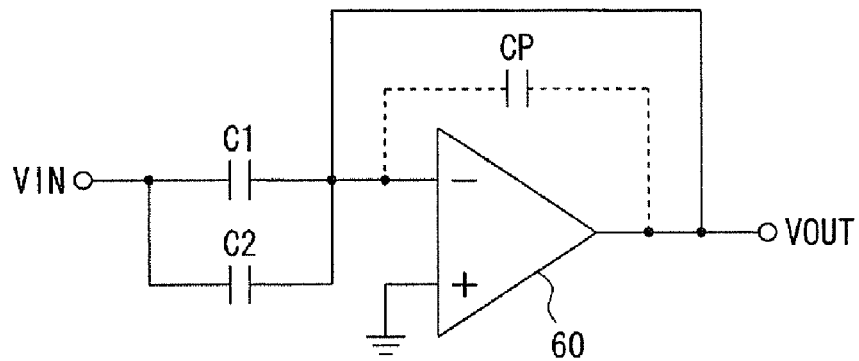
FIGS. 7A and 7B are views to explain the operation of the circuit shown in FIG. 5 in a case where parasitic capacitance is not negligible.

In the sampling operation, the condition is shown in FIG. 7A. The electric charge QS stored in the capacitors C1 and C2 is expressed in the following formula. The electric charge, however, is not charged because the parasitic capacitance CP is shorted at both ends thereof.

$$QS=(C1+C2)\times(VIN)$$

Figure 7B:
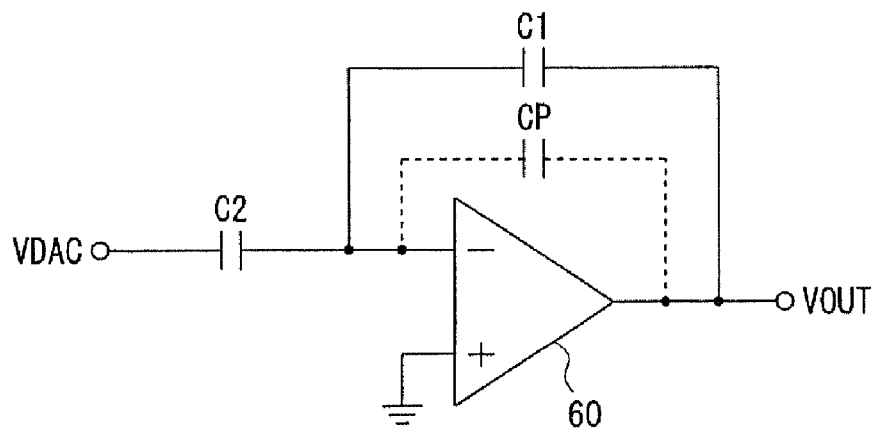

In contrast, in the holding operation, the condition is shown in FIG. 7B. The electric charge QH stored in the capacitors C1 and C2, and the parasitic capacitance CP is expressed in the following formula.

$$QH=(C1+CP)\times VOUT+C2\times VDAC$$

Here, QS=QH from a low of conservation of electric charge. Thus, the following formula is true.

$$(C1+C2)\times(VIN)=(C1+CP)\times VOUT+C2\times VDAC$$

If the capacitance values of the capacitors C1 and C2 are equal to C, i.e., C1=C2=C, the following formula can be obtained.

$$2\times C\times VIN=(C+CP)\times VOUT+C\times VDAC$$

As a result, the output voltage VOUT is expressed in formula (2).

$$VOUT=\{2C/(C+CP)\}\times VIN-\{C/(C+CP)\}VDAC \quad \text{formula (2)}$$

As can be understood from comparing the formulas (1) and (2), an error occurs in the gain (output) of the operational amplifier 60 in a case where the parasitic capacitance CP between the input and output terminals of the operational amplifier 60 is not negligible.

Because of this, in the first embodiment, the compensation circuit 56 shown in FIG. 3 is provided to compensate the output gain error of the operational amplifier 60 due to the parasitic capacitance CP.

Here, formula (3) can be obtained from formula (2).

$$VOUT=\{2(C+Ct1)/(C+CP)\}\times VIN-\{(C+Ct2)/(C+CP)\}VDAC \quad \text{formula (3)}$$

In formula (3), Ct1 and Ct2 respectively correspond to the capacitance value of the compensation capacitors Ct1 and Ct2. Therefore, with the assumption that Ct1=2CP, and Ct2=CP in formula (3), formula (3) equals formula (1).

Consequently, the compensation circuit 56 compensates the output gain error of the operational amplifier 60 due to the parasitic capacitance CP based on a condition that the relation between the compensation capacitance Ct1 and Ct2, and the parasitic capacitance CP satisfies a relation of Ct1=2CP and Ct2=CP.

The operation of the circuit shown in FIG. 3 is described with reference to FIGS. 3, 4A, and 4B.

Figure 4A:
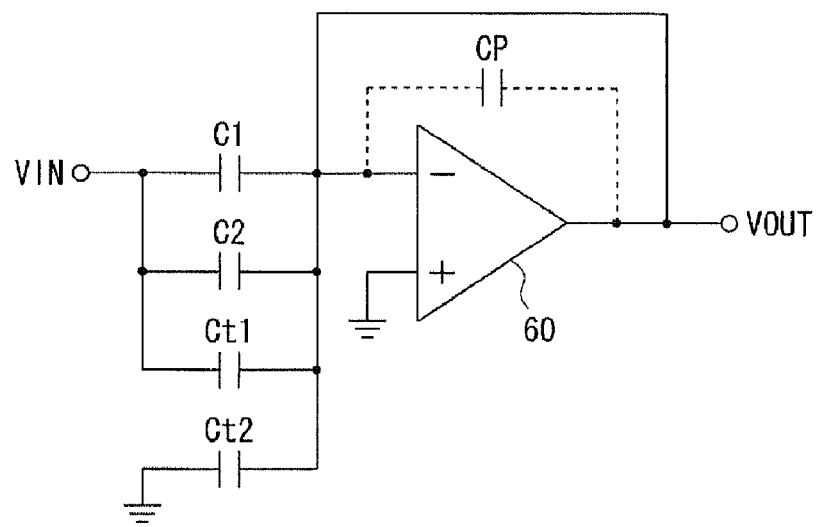
FIGS. 4A and 4B are views to explain the operation of the circuit shown in FIG. 3.
Figure 4B:
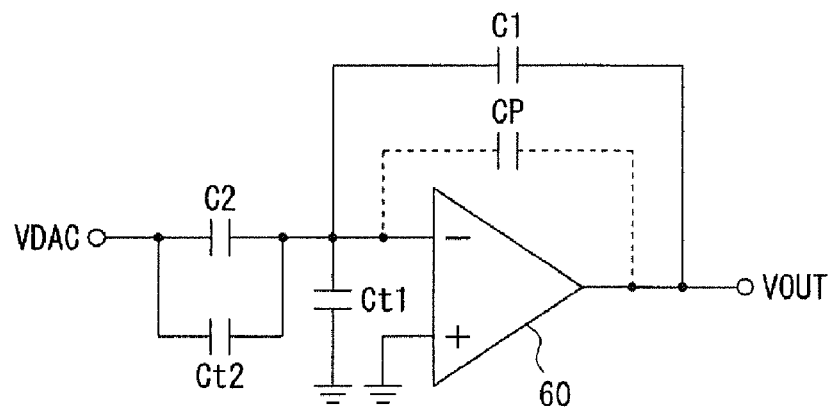

The sample hold circuit 51 performs a sampling operation shown in FIG. 4A and a holding operation (computing operation) shown in FIG. 4B.

In the sampling operation, the switches SW1, SW2, SW5, SW8, and SW9 are turned on while the switches SW3, SW4, SW6, and SW7 are turned off. The resulting condition is shown in FIG. 4A. As a result, electric charge of (C1+C2)×VIN is stored in the capacitors C1 and C2; electric charge of Ct1×VIN is stored in the compensation capacitor Ct1; and electric charge of Ct2×VOUT is stored in the compensation capacitor Ct2.

In this regard, since the VOUT is the ground level due to the negative feedback of the operational amplifier 60, the practical electrical charge of Ct2 is zero if an offset voltage is neglected. In FIG. 3, the switch SW9 is disposed between the common connection part of the capacitors C1 and C2, and the output terminal 63. The switch SW9 may be disposed between the common connection part and the ground.

In the holding operation, the switches SW3, SW4, SW6, and SW7 are turned on while the switches SW1, SW2, SW5, SW8, and SW9 are turned off. The resulting condition is shown in FIG. 4B. As a result, some amount of the electric charge of C1×VIN stored in the capacitor C1 is charged in the parasitic capacitance CP, reducing the electric charge of C1×VIN stored in the capacitor C1 by the amount.

As apparent from FIG. 4B, a feedback capacitor C1 of the operational amplifier 60 is connected in parallel with the parasitic capacitance CP having an initial electric charge of zero, resulting in a gain in the holding operation being reduced to 2×C2/(C1+C2) with the connection of the parasitic capacitance CP. Likewise, a gain relating to the analog voltage VDAC is also reduced to C2/(C1+CP). These reductions are caused by electric charge absorption by the parasitic capacitance CP.

The reduced amount caused by the parasitic capacitance CP is compensated by the following manner. As for the input voltage VIN, an electric charge of (Ct1×VIN) is added in the holding operation as the compensation. As for the analog voltage VDAC, an electronic charge of (Ct2×VDAC) is added as the compensation.

As described the above, in the first embodiment, the gain reduced by the parasitic capacitance between the input and output terminals of the operational amplifier 60 can be compensated by injecting electric charges using the compensation capacitors Ct1 and Ct2 in the holding operation shown in FIG. 4B. Consequently, the output gain error of the operational amplifier 60 can be compensated even in a case where the parasitic capacitance CP is not negligible.

Second Embodiment

A pipeline-type A/D converter of a second embodiment of the invention has the same whole structure of that shown in FIG. 1. In the pipeline-type A/D converter, the first stage 1-1 ($M^{th}$ stage ($1 \leq M<N$) in a broad sense) and the second stage 1-2 ($(M+1)^{th}$ stage in a broad sense) of FIG. 1 are structured as shown in FIG. 8.

Figure 8:
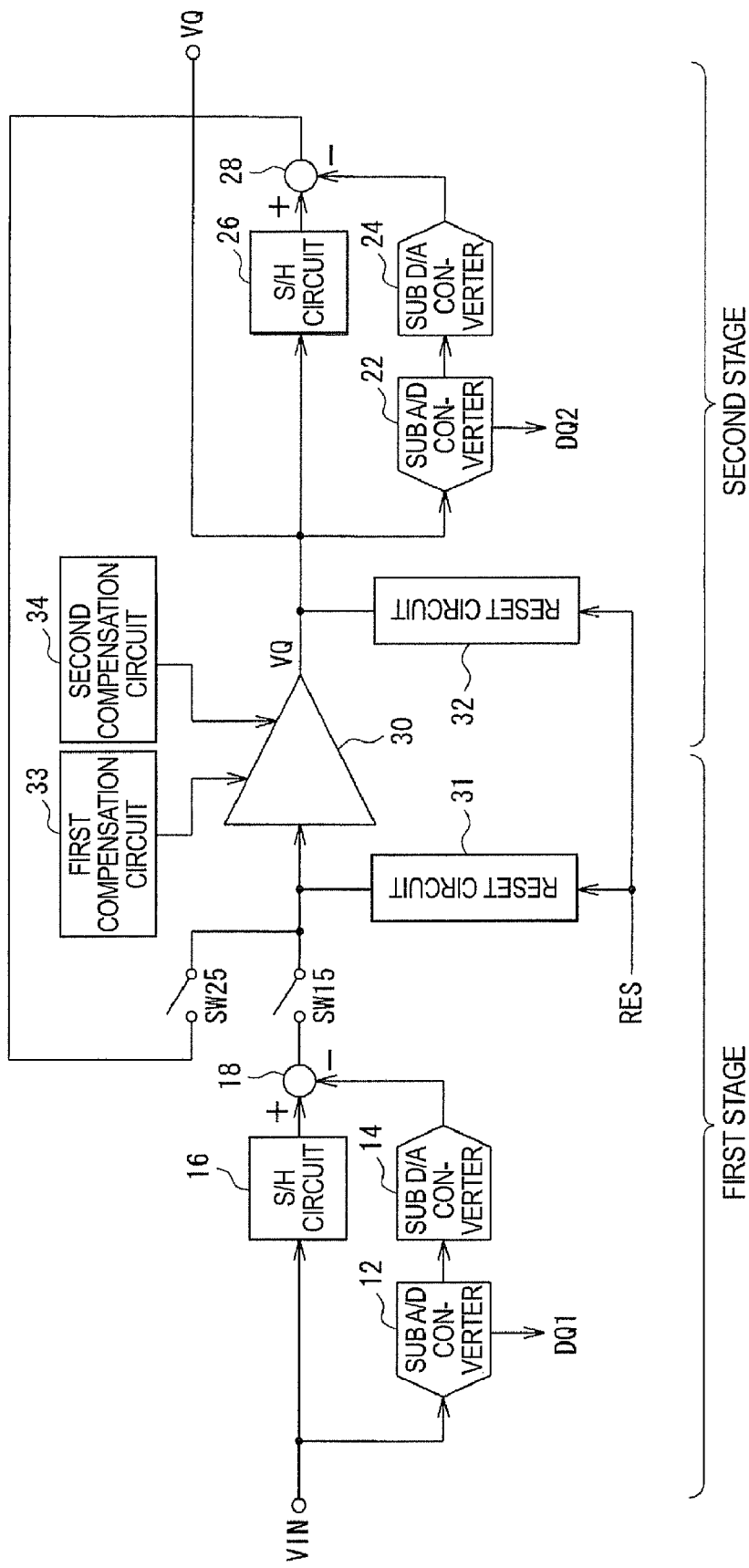
FIG. 8 is a block diagram showing a whole structure of a second embodiment of the invention.

In the second embodiment, in the first stage 1-1 and the second stage 1-2, an amplifier 30 composed of an operational amplifier is commonly used and reset circuits 31 and 32, and switches SW15 and SW 25 are additionally provided for the common usage, as shown in FIG. 8.

The structure of the first stage 1-1 and the second stage 1-2 of FIG. 8 is basically the same structure as that of FIG. 2 except for the amplifier 30 for the common usage, the reset circuits 31 and 32, and the switches SW15 and SW25.

The first stage 1-1 includes, as shown in FIG. 8, a sub A/D converter 12, a sub D/A converter 14, a sample hold circuit 16, a subtracter 18, and a first compensation circuit 33.

The sub A/D converter 12 A/D-converts the input signal VIN to output a digital signal of 1.5 bits. The sub D/A converter 14 converts the digital signal outputted from the sub A/D converter 12 into an analog signal. The sample hold circuit 16 samples and holds the input analog signal VIN. The subtracter 18 subtracts the analog signal outputted from the sub D/A converter 14 from the analog signal outputted from the sample hold circuit 16. A first compensation circuit 33 compensates the gain error of the amplifier 30 when the amplifier 30 for a common usage is used in the first stage 1-1.

The second stage 2-2 includes, as shown in FIG. 8, a sub A/D converter 22, a sub D/A converter 24, a sample hold circuit 26, a subtracter 28, and a second compensation circuit 34.

The sub A/D converter 22 A/D-converts the output of the amplifier 30 at a subtraction output of the first stage to output a digital signal of 1.5 bits. The sub D/A converter 24 converts the digital signal outputted from the sub A/D converter 22 into an analog signal. The sample hold circuit 26 samples and holds the output of the amplifier 30 at the subtraction output of the first stage. The subtracter 28 subtracts the analog signal outputted from the sub D/A converter 24 from the analog signal outputted from the sample hold circuit 26. A second compensation circuit 34 compensates the gain error of the amplifier 30 when the amplifier 30 for a common usage is used in the second stage 1-2.

In the second embodiment, as shown in FIG. 8, the amplifier 30 (a residue amplifier) is used in the first stage 1-1 and the second stage 1-2 in common. In other words, the amplifier 30 is used in a time-sharing manner in the first stage 1-1, and the second stage 1-2. The amplifier 30 amplifies a signal obtained by subtracting the analog signal outputted from the sub D/A converter 14 (24) from the analog signal held by the sample hold circuit 16 (26).

Specifically, a switch SW15 is disposed between the output terminal of the sample hold circuit 16 (subtracter 18) and the input terminal of the amplifier 30. In addition, a switch SW25 is disposed between the output terminal of the sample hold circuit 26 (subtracter 28) and the input terminal of the amplifier 30.

When the switch SW15 is turned on and the switch SW25 is turned off, the amplifier 30 is used in the first stage 1-1 to amplify (gain G=2) the analog signal after the subtraction. At this time, the gain error of the amplifier 30 is compensated by the first compensation circuit 33.

In contrast, when the switch SW25 is turned on and the switch SW15 is turned off, the amplifier 30 is used in the second stage 1-2 to amplify (gain G=2) the analog signal after the subtraction. At this time, the gain error of the amplifier 30 is compensated by the second compensation circuit 34.

In the second embodiment, the amplifier 30 is not necessarily used in common between all adjacent stages. The amplifier 30 may only be used in common between some adjacent stages.

In the second embodiment, the amplifier 30 is used in common between adjacent stages. Therefore, the following cases occur. In a case where the first stage 1-1 is in a sampling period, the amplifier 30 needs to operate for the second stage 1-2, because the second stage 1-2 is in a holding period (computing period). In contrast, in a case where the second stage 1-2 is in a sampling period, the amplifier 30 needs to operate for the first stage 1-1, because the first stage 1-1 is in a holding period (computing period).

In order to cope with the cases, in the second embodiment, the reset circuits 31 and 32 are provided as shown in FIG. 8 so as to reset the amplifier 30 at a predetermined timing.

Specifically, a reset signal RES is active at the following exemplified timing. Timing at which a sampling period is switched to a holding period in the first stage 1-1 and a holding period is switched to a sampling period in the second stage 1-2. Timing at which a holding period is switched to a sampling period in the first stage 1-1 and a sampling period is switched to a holding period in the second stage 1-2. As a result, the input and output terminals of the amplifier 30 are set to the voltage level (0V) of an analog ground AG so as to reset the amplifier 30.

Because of this structure, even if the output of the amplifier 30 is in an overflow state due to excess input, the amplifier 30 is reset before the amplifier 30 starts computing (holding). After the input returns to a normal value, the overflow state is not transferred to the succeeding stages. Thus, the output value of the pipeline A/D converter immediately returns to a normal value. As a result, a period can be reduced in which a great conversion error occurs.

A specific structure of the circuit of FIG. 8 is described with reference to FIG. 9.

Figure 9:
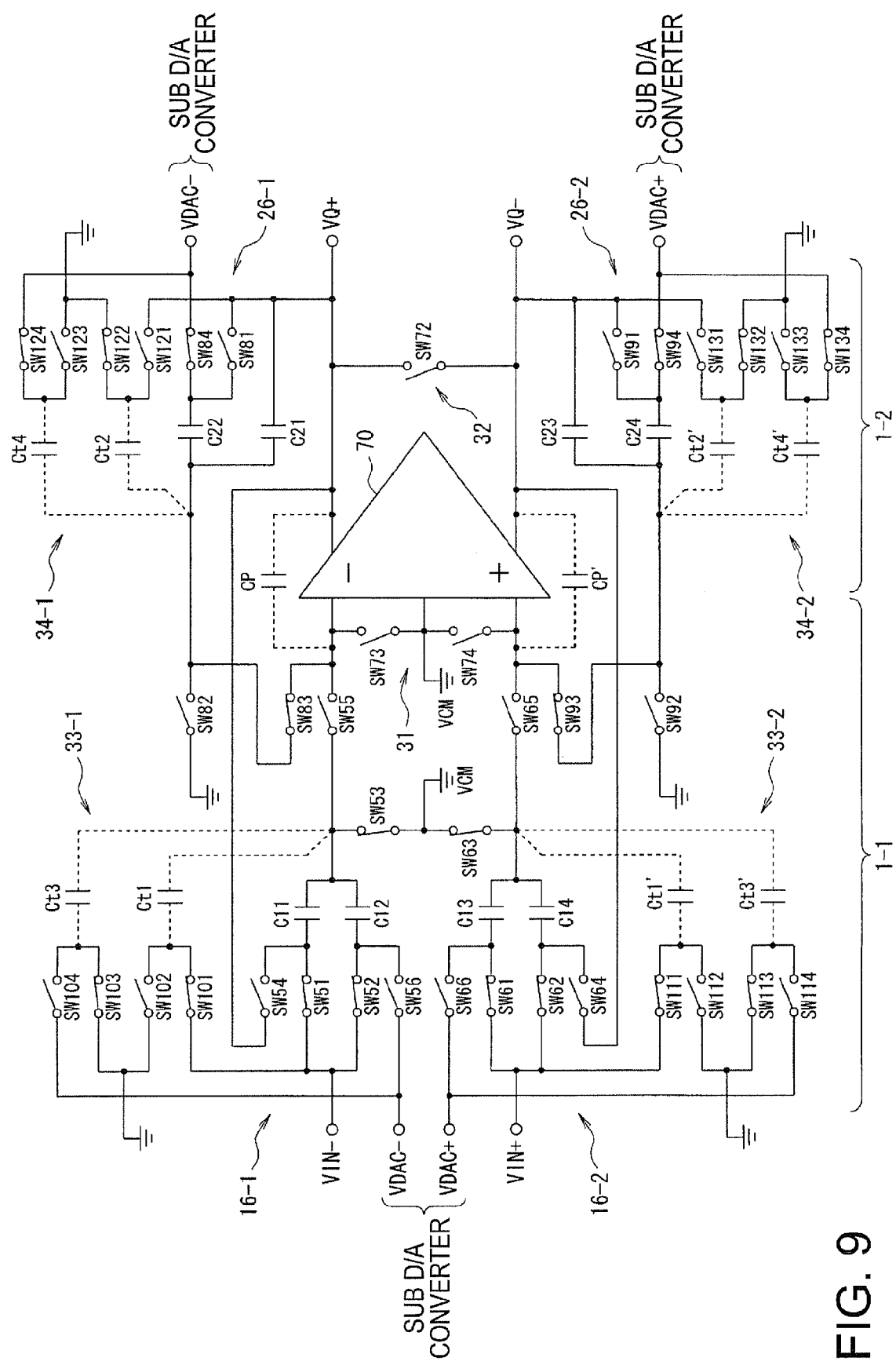
FIG. 9 is a circuit diagram showing a practical circuit structure and an operational state in a first period.

The specific example of FIG. 9 is structured in such a manner that the amplifier 30 of FIG. 8 is replaced with an operational amplifier 70 of a fully differential-type.

Because of this structure, the circuit of FIG. 9 is structured in such a manner that corresponding elements of FIG. 8, i.e., the sub A/D converter 12, the sub D/A converter 14, the sample hold circuit 16 and the first compensation circuit 33 in the first stage of FIG. 8, respectively include two similar constituting sections. Accordingly, the circuit of FIG. 9 includes 2 sample holding circuits 16-1 and 16-2, and 2 first compensation circuits 33-1 and 33-2, for example. As a reset circuit corresponding to the reset circuit 31 of FIG. 8, switches SW73 and SW74 are provided.

The circuit of FIG. 9 is also structured in such a manner that corresponding elements of FIG. 8, i.e., the sub A/D converter 22, the sub D/A converter 24, the sample hold circuit 26 and the second compensation circuit 34 in the second stage of FIG. 8, respectively include two similar constituting sections. Accordingly, the circuit of FIG. 9 includes 2 sample hold circuits 26-1 and 26-2, and 2 second compensation circuits 34-1 and 34-2, for example. As a reset circuit corresponding to the reset circuit 32 of FIG. 8, a switch SW72 is provided.

The circuit of FIG. 9 is further described.

The sample hold circuits 16-1 and 16-2 are disposed at a side adjacent to input terminals of the operational amplifier 70. The sample hold circuit 16-1 includes switches SW51 to SW56 each composed of a switching element and the like, and capacitors C11 and C12, as shown in FIG. 9. Likewise, the sample hold circuit 16-2 includes switches SW56 to SW 66 each composed of a switching element and the like, and capacitors C13 and C14.

The sample hold circuits 26-1 and 26-2 are disposed at a side adjacent to output terminals of the operational amplifier 70. The sample hold circuit 26-1 includes switches SW81 to SW84 each composed of a switching element and the like, and capacitors C21 and C22, as shown in FIG. 9. Likewise, the sample hold circuit 26-2 includes switches SW91 to SW 94 each composed of a switching element and the like, and capacitors C23 and C24.

The compensation circuits 33-1, and 33-2 respectively compensate gain errors caused by the parasitic capacitance CP and the parasitic capacitance CP' that exist between the input and output terminals of the operational amplifier 70 when the operational amplifier 70 performs a differential amplification in the first stage 1-1.

Accordingly, the compensation circuit 33-1 includes switches SW101 to SW104 each composed of a switching element and the like, the compensation capacitor Ct1 and a compensation capacitor Ct3, as shown in FIG. 9. Likewise, the compensation circuit 33-2 includes switches SW111 to SW 114 each composed of a switching element and the like, and capacitors Ct1' and Ct3'.

Here, the capacitance values of the compensation capacitors Ct1 and Ct3 satisfy a relation that Ct1=2CP and Ct3=CP where CP is the capacitance value of the parasitic capacitance CP. Likewise, the capacitance values of the compensation capacitors Ct1' and Ct3' satisfy a relation that Ct1'=2CP' and Ct3'=CP' where CP' is the capacitance value of the parasitic capacitance CP'.

Capacitance between wiring lines can be used if the conditions described above are satisfied without particularly providing the compensation capacitors Ct1, Ct3, Ct1', and Ct3'. If the capacitance between wiring lines does not satisfy the conditions, capacitors may be additionally provided to cover the insufficient capacitance value. Alternatively, MOS capacitance using parasitic capacitance between a gate and a drain or the gate and a source of a MOS transistor may be used as the compensation capacitor.

Compensation circuits 34-1, and 34-2 respectively compensate gain errors caused by the parasitic capacitance CP and the parasitic capacitance CP' that exist between the input and output terminals of the operational amplifier 70 when the operational amplifier 70 performs a differential amplification in the second stage 1-2.

Accordingly, the compensation circuit 34-1 includes switches SW121 to SW124 each composed of a switching element and the like, the compensation capacitor Ct2 and a compensation capacitor Ct4, as shown in FIG. 9. Likewise, the compensation circuit 34-2 includes switches SW131 to SW 134 each composed of a switching element and the like, and capacitors Ct2' and Ct4'.

Here, the capacitance values of the compensation capacitors Ct2 and Ct4 satisfy a relation that Ct2=2CP and Ct4=CP where CP is the capacitance value of the parasitic capacitance CP. Likewise, the capacitance values of the compensation capacitors Ct2' and Ct4' satisfy a relation that Ct2'=2CP' and Ct4'=CP' where CP' is the capacitance value of the parasitic capacitance CP'.

Capacitance between wiring lines can be used if the conditions described above are satisfied without particularly providing the compensation capacitors Ct2, Ct4, Ct2', and Ct4'. If the capacitance between wiring lines does not satisfy the conditions, capacitors may be additionally provided to cover the insufficient capacitance value. Alternatively, MOS capacitance using parasitic capacitance between a gate and a drain or the gate and a source of a MOS transistor may be used as the compensation capacitor.

An operational example of the circuit of FIG. 9 structured as described above is described with reference to FIGS. 9 to 11.

Figure 10:
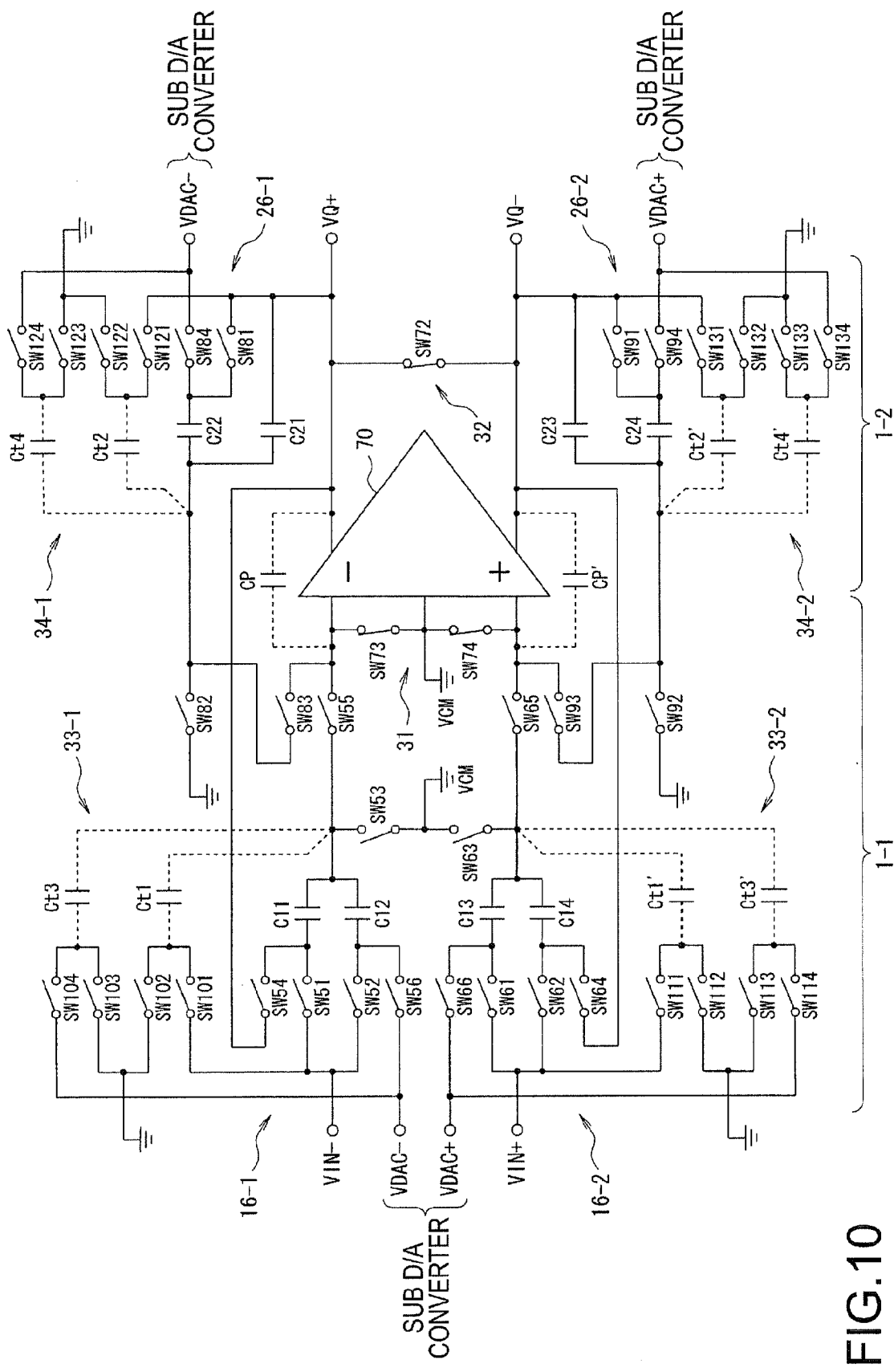
FIG. 10 is a circuit diagram showing an operational state in a reset period in the circuit shown in FIG. 9.
Figure 11:
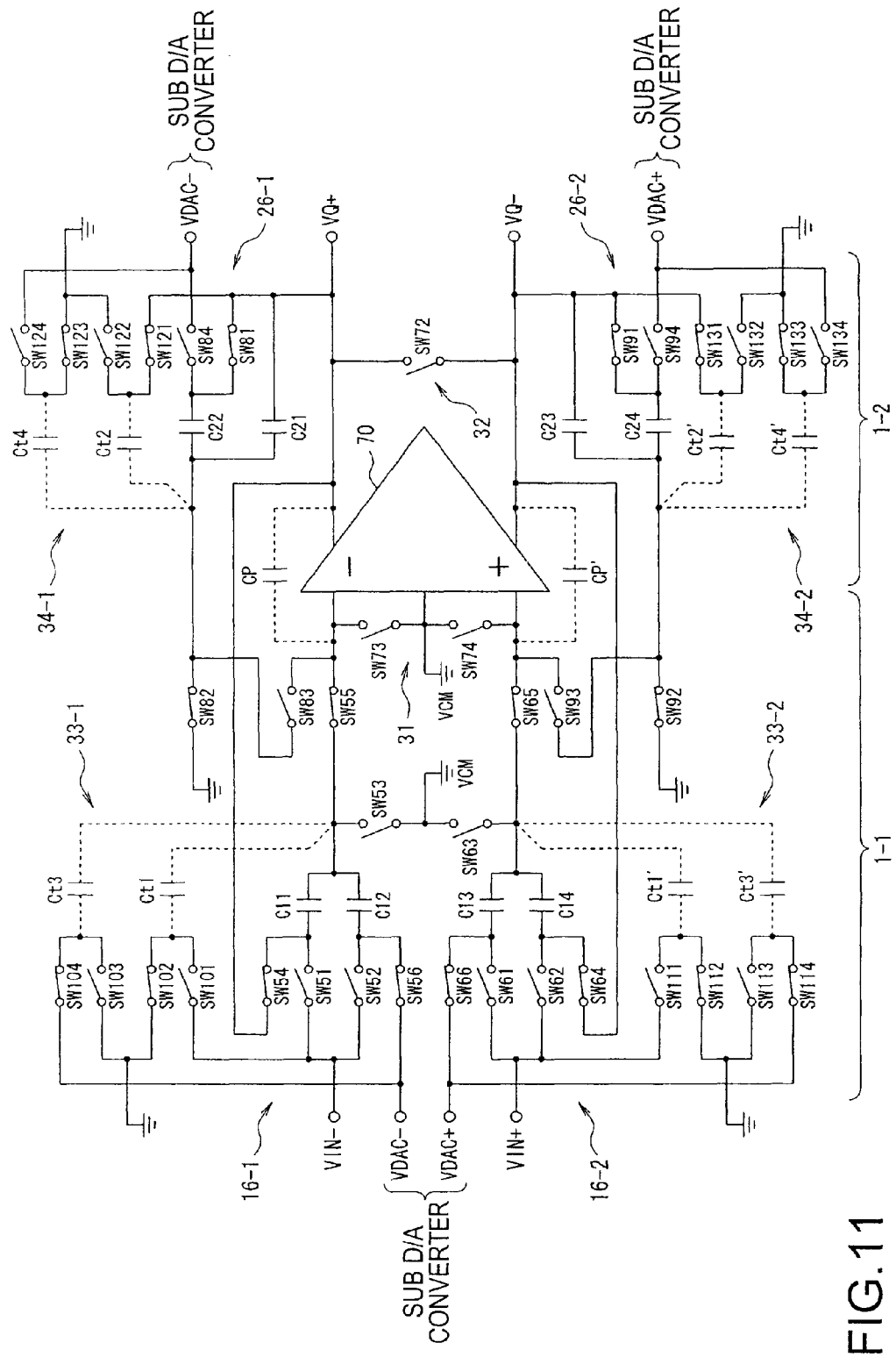
FIG. 11 is a circuit diagram showing an operational state in a second period in the circuit shown in FIG. 9.

In a first period of the operation of the circuit of FIG. 9, the first stage 1-1 is in a sampling operation and the second stage 1-2 is in a holding operation. The conditions of the switches are shown in FIG. 9. In a reset period after the completion of the first period, the conditions of the switches are shown in FIG. 10. Further, in a second period after the completion of the reset period, the first stage 1-1 is in a holding operation and the second stage 1-2 is in a sampling operation. The conditions of the switches are shown in FIG. 11.

In the first period, the conditions of the switches are as follows. In the sample hold circuit 16-1, the switches SW51 to SW53 are turned on while the switches SW54 to SW56 are turned off. In the sample hold circuit 16-2, the switches SW61 to SW63 are turned on while the switches SW64 to SW66 are turned off. In the compensation circuit 33-1, the switches SW101 and SW103 are turned on while the switches SW102 and SW104 are turned off. In the compensation circuit 33-2, the switches SW111 and SW113 are turned on while the switches SW112 and SW114 are turned off. The switch SW72 serving as the reset circuit 32, and the switches SW73 and SW74 that serve as the reset circuit 32 are turned off.

As a result, the sample hold circuits 16-1 and 16-2 sample the input analog signals VIN+ and VIN−.

In the sample hold circuit 26-1, the switches SW83 and SW84 are turned on while the switches SW81 and SW82 are turned off. In the sample hold circuit 26-2, the switches SW93 and SW94 are turned on while the switches SW91 and SW92 are turned off. In the compensation circuit 34-1, the switches SW122 and SW124 are turned on while the switches SW121 and SW123 are turned off. In the compensation circuit 34-2, the switches SW132 and SW134 are turned on while the switches SW131 and SW133 are turned off. The switch SW72 serving as the reset circuit 32, and the switches SW73 and SW74 that serve as the reset circuit 32 are turned off.

As a result, the sample hold circuits 26-1, 26-2, and the operational amplifier 70 perform computing such as subtraction and amplification to hold a voltage. In this process, the compensation circuit 34-1 compensates the parasitic error due to the parasitic capacitance CP while the compensation circuit 34-2 compensates the gain error due to the parasitic capacitance CP'. The parasitic capacitance CP and the parasitic capacitance CP' exist between the input and output terminals of the operational amplifier 70. The principle of the compensation is the same as that described in the first embodiment shown in FIG. 1. The explanation is omitted.

In the rest period, the condition is shown in FIG. 10. The switch SW72 serving as the reset circuit 32, and the switches SW 73 and SW74 that serve as the reset circuit 32 are turned on while other switches are turned off.

In the second period, the conditions of the switches are as follows. In the sample hold circuit 16-1, the switches SW54 to SW56 are turned on while the switches SW51 to SW53 are turned off. In the sample hold circuit 16-2, the switches SW64 to SW66 are turned on while the switches SW61 to SW63 are turned off. In the compensation circuit 33-1, the switches SW102 and SW104 are turned on while the switches SW101 and SW103 are turned off. In the compensation circuit 33-2, the switches SW112 and SW114 are turned on while the switches SW111 and SW113 are turned off. The switch SW72 serving as the reset circuit 32, and the switches SW73 and SW74 that serve as the reset circuit 32 are turned off.

As a result, the sample hold circuits 16-1, 16-2, and the operational amplifier 70 perform computing such as subtraction and amplification to hold a voltage. In this process, the compensation circuit 33-1 compensates the parasitic error due to the parasitic capacitance CP while the compensation circuit 33-2 compensates the gain error due to the parasitic capacitance CP'. The parasitic capacitance CP and the parasitic capacitance CP' exist between the input and output terminals of the operational amplifier 70.

In the sample hold circuit 26-1, the switches SW81 and SW82 are turned on while the switches SW83 and SW84 are turned off. In the sample hold circuit 26-2, the switches SW91 and SW92 are turned on while the switches SW93 and SW94 are turned off. In the compensation circuit 34-1, the switches SW121 and SW123 are turned on while the switches SW122 and SW124 are turned off. In the compensation circuit 34-2, the switches SW131 and SW133 are turned on while the switches SW132 and SW134 are turned off. The switch SW72 serving as the reset circuit 32, and the switches SW73 and SW74 that serve as the reset circuit 32 are turned off.

As a result, the sample hold circuits 26-1 and 26-2 sample the output voltage VQ+ and VQ− that are outputted from the operational amplifier 70.

In the rest period, the condition is shown in FIG. 10. The switch SW72 serving as the reset circuit 32, and the switches SW 73 and SW74 that serve as the reset circuit 32 are turned on while other switches are turned off.

As described above, the operational amplifier 70 can be commonly used between stages and reset also in a case where the operational amplifier 70 is of a fully differential-type as shown in FIG. 9. The compensation circuits 33-1, and 33-2 respectively compensate gain errors caused by the parasitic capacitance CP and the parasitic capacitance CP' that exist between the input and output terminals of the operational amplifier 70 when the operational amplifier 70 performs a differential amplification in the first stage 1-1. The compensation circuits 34-1, and 34-2 respectively compensate gain errors caused by the parasitic capacitance CP and the parasitic capacitance CP' when the operational amplifier 70 performs a differential amplification in the second stage 1-2.

Modification

FIG. 2 shows a circuit in which a part of the circuit shown in FIG. 9 is replaced as described below.

In the circuit shown in FIG. 9, the compensation circuit 33-1 uses the input signal VIN− and output VDAC− of the D/A converter, and includes the compensation capacitors Ct1 and Ct3 and the switches SW101 to SW104.

Figure 12:
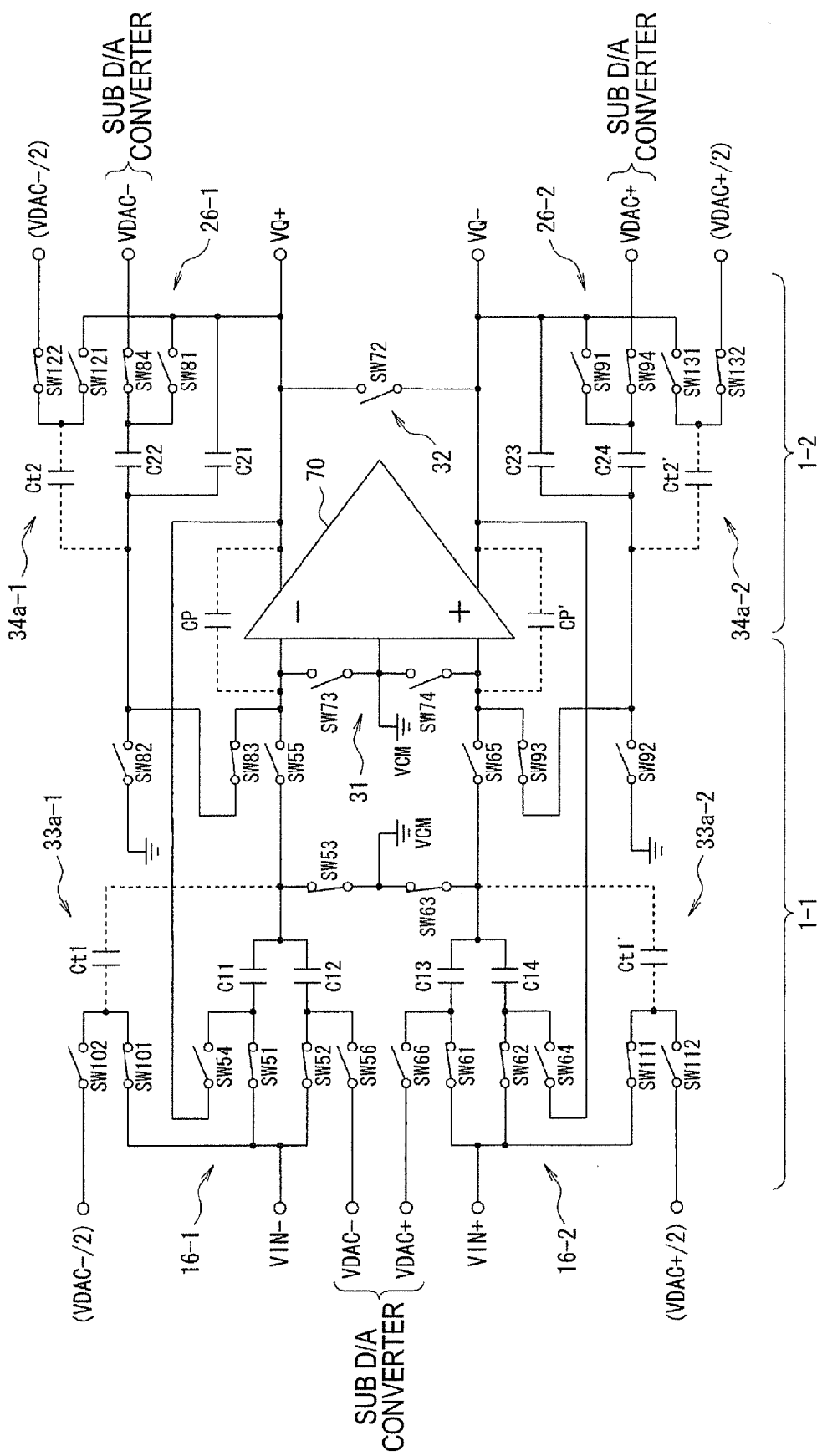
FIG. 12 is a circuit diagram showing a first modification example of the circuit shown in FIG. 9.

In contrast, as shown in FIG. 12, a compensation circuit 33a-1 includes the compensation capacitor Ct1 instead of the compensation capacitors Ct1 and Ct3 when an output (VDAC−)/2 is provided as the output VDAC− of the D/A converter for the compensation circuit 33-1. The reason is described later.

Based on the reason, the circuit shown in FIG. 12 is obtained by replacing the compensation circuits 33-1, 33-2, 34-1, and 34-2 with the compensation circuit 33a-1, 33a-2, 34a-1, and 34a-2.

Accordingly, as shown in FIG. 12, those compensation circuits are structured as follows. The compensation circuit 33a-1 includes the compensation capacitor Ct1 and the switches SW101 and SW102. The compensation circuit 33a-2 includes the compensation capacitor Ct1' and the switches SW 111 and SW112. Likewise, the compensation circuit 34a-1 includes the compensation capacitor Ct2 and the switches SW 121 and SW122. The compensation circuit 34a-2 includes the compensation capacitor Ct2' and the switches SW 131 and SW132.

Here, the capacitance values of the compensation capacitors Ct1 and Ct2 satisfy a relation that Ct1=Ct2−2CP where CP is the capacitance value of the parasitic capacitance CP. Likewise, the capacitance values of the compensation capacitors Ct1' and Ct2' satisfy a relation that Ct1'=Ct2'=2CP' where CP' is the capacitance value of the parasitic capacitance CP'.

The reason why the compensation circuit 33-1 including the compensation capacitors Ct1 and Ct3 can be replaced with the compensation circuit 33a-1 including the compensation capacitor Ct1 (single compensation capacitor) is as follows.

In the circuit shown in FIG. 12, the output voltage VOUT of the operational amplifier 70 is expressed by the following formula.

$$VOUT=\{2C/(C+CP)\} \times VIN+\{Ct/(C+CP)\}\{VIN-(VDAC/2)\}-\{C/(C+CP)\}VDAC$$

Substituting Ct (Ct1)=2CP in the formula, the following formula is finally obtained.

$$VOUT=2VIN-VDAC$$

As described above, providing VDAC±/2 for the circuit shown in FIG. 12 can realize the compensation circuits 33a-1, 33a-2, 34a-1, and 34a-2 as simplified circuits.

Figure 13:
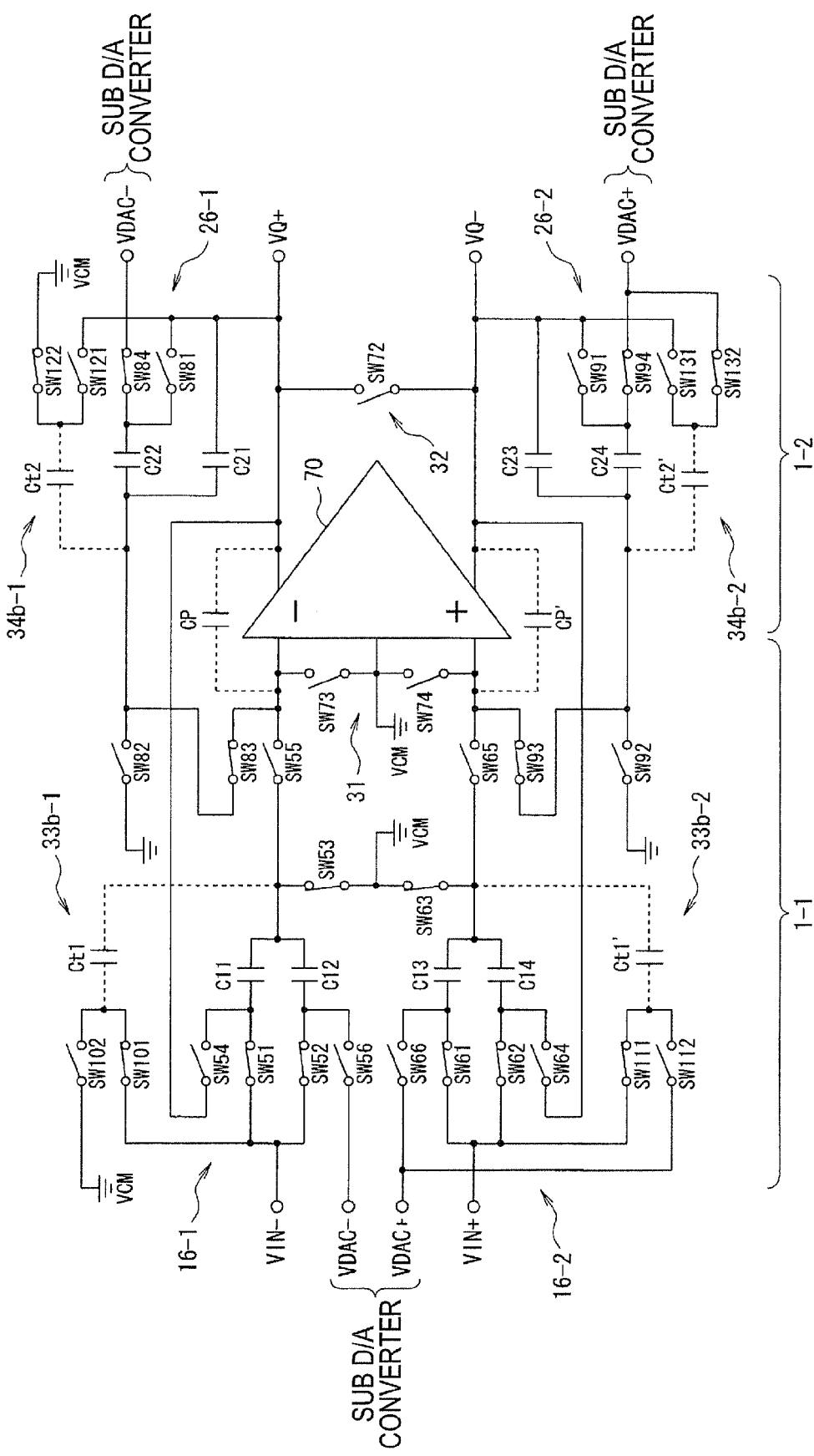
FIG. 13 is a circuit diagram showing a second modification example of the circuit shown in FIG. 9.

FIG. 13 shows a circuit that includes compensation circuits 33b-1, 33b-2, 34b-1, and 34b-2 based on the circuit shown in FIG. 9 without providing VDAC±/2 as VDAC for the circuit shown in FIG. 12. In FIG. 12, the VDAC±/2 can be readily obtained as a differential signal by inputting the VDAC+ into the VDAC+/2 input terminal while the VDAC−/2 input terminal is fixed to VCM instead of newly providing the VDAC±/2. This is because the circuit of the invention operates in a fully-differential manner, so that a difference is only processed as a signal. This is also supported by the fact that the VDAC± changes symmetrically with the VCM.

Thus, one end of each of the switches SW102 and SW122 in the compensation circuits 33b-1 and 34b-1 is fixed by the potential VCM by applying the potential thereto. In the compensation circuits 33b-2 and 34b-2, the VDAC+ is applied to one end of each of the switches SW112 and SW132.

Because of the structure, the compensation circuits 33b-1, 33b-2, 34b-1, and 34b-2 can demonstrate the same compensation effect of the compensation circuits 33a-1, 33a-2, 34a-1, and 34a-2 of FIG. 12.

What is claimed is:

1. A pipeline-type analog-to-digital (A/D) converter, comprising:
   N number of stages cascade-connected; and
   a digital correction circuit that receives digital signals outputted from the N number of stages and outputs a final digital signal, wherein an Mth stage in the N number of stages includes:
   a sub A/D converter A/D-converting an input analog signal;
   a sub digital-to-analog (D/A) converter D/A converting a digital signal outputted from the sub A/D converter;
   a differential amplifier circuit that includes a sample hold circuit and an operational amplifier, performs an sampling operation and a holding operation to obtain a difference between the input analog signal and an output signal of the sub D/A converter, and amplifies the difference; and
   a compensation circuit compensating a gain error of the operational amplifier in an operation of the differential amplifier circuit, the gain error being caused by parasitic capacitance between an input terminal and an output terminal of the operational amplifier, and wherein $1 \leq M < N$.

2. The pipeline-type A/D converter according to claim 1, wherein the compensation circuit compensates, in the operation of the differential amplifier circuit, an electric charge flowing into the parasitic capacitance between the input terminal and the output terminal of the operational amplifier from a capacitor of the sample hold circuit with respect to the capacitor.

3. The pipeline-type A/D converter according to claim 1, the compensation circuit including:
   a first circuit having:
   a first switch selecting the input analog signal;
   a second switch selecting a predetermined potential; and
   a first compensation capacitor selectively receiving the input analog signal selected by the first switch and the predetermined potential selected by the second switch, one end of the first compensation capacitor being coupled to the input terminal of the operational amplifier; and
   a second circuit having:
   a third switch selecting the output signal of the sub D/A converter;
   a fourth switch selecting the predetermined potential; and
   a second compensation capacitor selectively receiving the output signal selected by the third switch and the predetermined potential selected by the fourth switch, one end of the second capacitor being coupled to the input terminal of the operational amplifier.

4. The pipeline-type A/D converter according to claim 3, wherein, in the compensation circuit, in the sampling operation of the sample hold circuit, the first switch selects the input analog signal to input the selected input analog signal to the first compensation capacitor, and the fourth switch selects the predetermined potential to input the selected predetermined potential to the second compensation capacitor, while, in the holding operation of the sample hold circuit, the second switch selects the predetermined potential to input the selected predetermined potential to the first compensation capacitor, and the third switch selects the output signal of the sub D/A converter to input the selected output signal to the second compensation capacitor.

5. A pipeline-type analog-to-digital (A/D) converter, comprising:
   N number of stages cascade-connected; and
   a digital correction circuit that receives digital signals outputted from the N number of stages and outputs a final digital signal, wherein an Mth stage and an M+1th stage in the N number of stages commonly use an operational amplifier in a time-sharing manner, wherein the Mth stage includes:
   a first sub A/D converter A/D-converting an input analog signal;
   a first sub digital-to-analog (D/A) converter D/A converting a digital signal outputted from the first sub A/D converter; and
   a first differential amplifier circuit that includes a first sample hold circuit, performs an sampling operation and a holding operation to obtain a difference between the input analog signal and an output signal of the first sub D/A converter, and amplifies the difference; and
   a first compensation circuit compensating a gain error of the operational amplifier, if the first differential amplifier circuit uses the operational amplifier, the gain error being caused by parasitic capacitance between an input terminal and an output terminal of the operational amplifier; and
   the M+1th stage includes:
   a second sub A/D converter A/D-converting an analog signal outputted from the operational amplifier;
   a second sub D/A converter D/A-converting a digital signal outputted from the second sub A/D converter;

a second differential amplifier circuit that includes a second sample hold circuit, performs an sampling operation and a holding operation to obtain a difference between the analog signal outputted from the operational amplifier and an output signal of the second sub D/A converter, and amplifies the difference; and a second compensation circuit compensating a gain error of the operational amplifier, if the second differential amplifier circuit uses the operational amplifier, the gain error being caused by the parasitic capacitance between the input terminal and the output terminal of the operational amplifier, and wherein $1 \leq M < N$.

6. The pipeline-type A/D converter according to claim 5, wherein the operational amplifier is of a fully-differential type.

* * * * *